(12) United States Patent
Talledo

(10) Patent No.: US 10,008,472 B2
(45) Date of Patent: Jun. 26, 2018

(54) METHOD FOR MAKING SEMICONDUCTOR DEVICE WITH SIDEWALL RECESS AND RELATED DEVICES

(71) Applicant: STMICROELECTRONICS, INC., Calamba (PH)

(72) Inventor: Jefferson Talledo, Calamba (PH)

(73) Assignee: STMICROELECTRONICS, INC., Calamba, Laguna (PH)

( * ) Notice: Subject to any disclaimer, the term of this patent is extended or adjusted under 35 U.S.C. 154(b) by 0 days. days.

(21) Appl. No.: 14/753,365

(22) Filed: Jun. 29, 2015

(65) Prior Publication Data
US 2016/0379916 A1 Dec. 29, 2016

(51) Int. Cl.
*H01L 23/48* (2006.01)
*H01L 23/52* (2006.01)
(Continued)

(52) U.S. Cl.
CPC .......... *H01L 24/85* (2013.01); *H01L 21/4842* (2013.01); *H01L 21/561* (2013.01);
(Continued)

(58) Field of Classification Search
CPC . H01L 2224/80897; H01L 2224/81897; H01L 2224/83897; H01L 2224/80345; H01L 2224/80365; H01L 2224/80385; H01L 2224/81345; H01L 2224/81365; H01L 2224/81385; H01L 2224/82345; H01L 2224/82365; H01L 2224/82385; H01L 2224/83345; H01L 2224/83365; H01L 2224/83385; H01L 2224/84345; H01L 2224/84365; H01L 2224/84385; H01L 2224/86345; H01L 2224/86365; H01L 2224/86385; H01L 2224/0807; H01L 2224/1607; H01L 2224/3207; H01L 2224/4007; H01L 2224/4807; H01L 2224/95; H01L 2924/18301; H01L 24/95; H01L 21/561; H01L 21/78;
(Continued)

(56) References Cited

U.S. PATENT DOCUMENTS 6,214,640 B1 * 4/2001 Fosberry ............... H01L 21/56
257/E21.502
6,246,111 B1 * 6/2001 Huang ................. H01L 21/565
257/666
(Continued)

FOREIGN PATENT DOCUMENTS

| CN | 1812084 A | 8/2006 |
| CN | 205376495 U | 7/2016 |
| WO | WO 2008105437 A1 * | 9/2008 ........... H01L 21/561 |

*Primary Examiner* — Teresa M Arroyo
(74) *Attorney, Agent, or Firm* — Slater Matsil, LLP

(57) ABSTRACT

A method is for making a semiconductor device. The method may include providing a lead frame having a recess, forming a sacrificial material in the recess of the lead frame, and mounting an IC on the lead frame. The method may include encapsulating the IC and the lead frame, removing portions of the lead frame to define lead frame contacts for the IC, and removing the sacrificial material to define for each lead frame contact a solder anchoring tab extending outwardly at a lower region and defining a sidewall recess between opposing portions of the solder anchoring tab and the encapsulation material.

23 Claims, 5 Drawing Sheets

(51) Int. Cl.
*H01L 21/00* (2006.01)
*H01L 23/00* (2006.01)
*H01L 21/56* (2006.01)
*H01L 21/78* (2006.01)
*H01L 21/48* (2006.01)
*H01L 23/31* (2006.01)
*H01L 23/495* (2006.01)

(52) U.S. Cl.
CPC .......... *H01L 21/78* (2013.01); *H01L 23/3121* (2013.01); *H01L 23/49544* (2013.01); *H01L 24/97* (2013.01); *H01L 23/49503* (2013.01); *H01L 23/49582* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/73265* (2013.01); *H01L 2224/97* (2013.01); *H01L 2924/181* (2013.01)

(58) Field of Classification Search
CPC ....... H01L 2224/14; H01L 2224/48247; H01L 23/3107; H01L 23/49503; H01L 23/49541; H01L 23/49582; H01L 23/49861; H01L 24/43; H01L 24/49; H01L 24/85; H01L 2924/0105; H01L 2924/1715; A61N 1/36125; A61N 1/37223; A61N 1/3727; A61N 1/3787; H02J 2007/0096; H02J 7/0052; H02J 7/007; H02J 7/025; H03C 3/00; H04B 5/0037

USPC .................. 257/692, 676; 438/110, 458, 112
See application file for complete search history.

(56) References Cited

U.S. PATENT DOCUMENTS

| | | | |
|---|---|---|---|
| 6,521,987 | B1 | 2/2003 | Glenn et al. |
| 7,397,112 | B2 | 7/2008 | Sato et al. |
| 8,076,181 | B1* | 12/2011 | Pruitt .................... H01L 21/561 257/E21.499 |
| 8,242,614 | B2 | 8/2012 | Abbott |
| 8,937,379 | B1* | 1/2015 | Do .................... H01L 23/49541 257/666 |
| 2001/0044169 | A1 | 11/2001 | Yasunaga et al. |
| 2002/0074672 | A1* | 6/2002 | Huang ................ H01L 21/4832 257/788 |
| 2004/0238934 | A1* | 12/2004 | Warner ................ H01L 23/24 257/686 |
| 2005/0046001 | A1* | 3/2005 | Warner ................ G06F 21/10 257/678 |
| 2006/0138615 | A1* | 6/2006 | Sato ................ H01L 23/49548 257/666 |
| 2007/0080437 | A1* | 4/2007 | Marimuthu ........... H01L 21/561 257/676 |
| 2010/0050431 | A1* | 3/2010 | Suzuki .................... G01R 3/00 29/874 |
| 2010/0127363 | A1* | 5/2010 | Nondhasitthichai .... H01L 24/06 257/673 |
| 2015/0262918 | A1* | 9/2015 | Tran .................... H01L 21/4842 257/676 |
| 2016/0379916 | A1 | 12/2016 | Talledo |

* cited by examiner

US 10,008,472 B2

METHOD FOR MAKING SEMICONDUCTOR DEVICE WITH SIDEWALL RECESS AND RELATED DEVICES

TECHNICAL FIELD

The present disclosure relates to the field of semiconductor processing, and, more particularly, to a method for making a semiconductor device.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via bond wires or solder bumps.

One approach to IC packaging comprises a quad-flat no-leads (QFN) package. The QFN package may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

Referring initially to FIG. 1, a typical QFN packaged electronic device 100 is now described. The electronic device 100 includes an IC die pad 104, an IC 105 on the IC die pad, and an adhesive layer 106 between the IC die pad and the IC. The electronic device 100 includes a plurality of lead frame contacts 103a-103b, and a plurality of bond wires 102a-102b coupling the plurality of lead frame contacts with the IC 105. The electronic device 100 includes encapsulation material 101 surrounding the plurality of bond wires 102a-102b and the IC 105.

SUMMARY

Generally speaking, a method is for making a semiconductor device. The method may comprise providing a lead frame having a recess therein, forming a sacrificial material in the recess of the lead frame, and mounting an IC on the lead frame. The method may also include encapsulating the IC and the lead frame, removing portions of the lead frame to define a plurality of lead frame contacts for the IC, and removing the sacrificial material to define for each lead frame contact a solder anchoring tab extending outwardly at a lower region thereof and defining a sidewall recess between opposing portions of the solder anchoring tab and the encapsulation material.

More specifically, removing portions of the lead frame may comprise singulating the IC by dicing the lead frame at the recess. For example, the sacrificial material may comprise at least one of a thermally decomposable material, a water soluble material, and a photosensitive material. The method may further comprise forming a plurality of bond wires, each bond wire coupling a respective lead frame contact with the IC.

In some embodiments, the method further comprises forming a plating layer (e.g. tin) on the solder anchoring tab. Each lead frame contact may comprise a mold anchoring tab extending inwardly from an upper region thereof. Also, encapsulating may include forming the encapsulation material to surround the mold anchoring tab. The lead frame may define an IC die pad having a plurality of mold anchoring tabs extending outwardly from an upper region thereof.

Another aspect is directed to a semiconductor device. The semiconductor device may include at least one IC, an IC die pad aligned with the at least one IC, and a plurality of lead frame contacts adjacent the IC die pad, each lead frame contact having a solder anchoring tab extending outwardly at a lower region thereof. The semiconductor device may also comprise a plurality of bond wires, each bond wire coupling a respective lead frame contact with the at least one IC. The semiconductor device may also include encapsulation material surrounding the at least one IC and the plurality of bond wires, each lead frame contact defining a sidewall recess between the solder anchoring tab and the encapsulation material. Additionally, the semiconductor device may further comprise a circuit board layer having a plurality of contacts therein, and a plurality of solder bodies surrounding the solder anchoring tabs and coupling the plurality of contacts and the plurality of lead frame contacts.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 2:
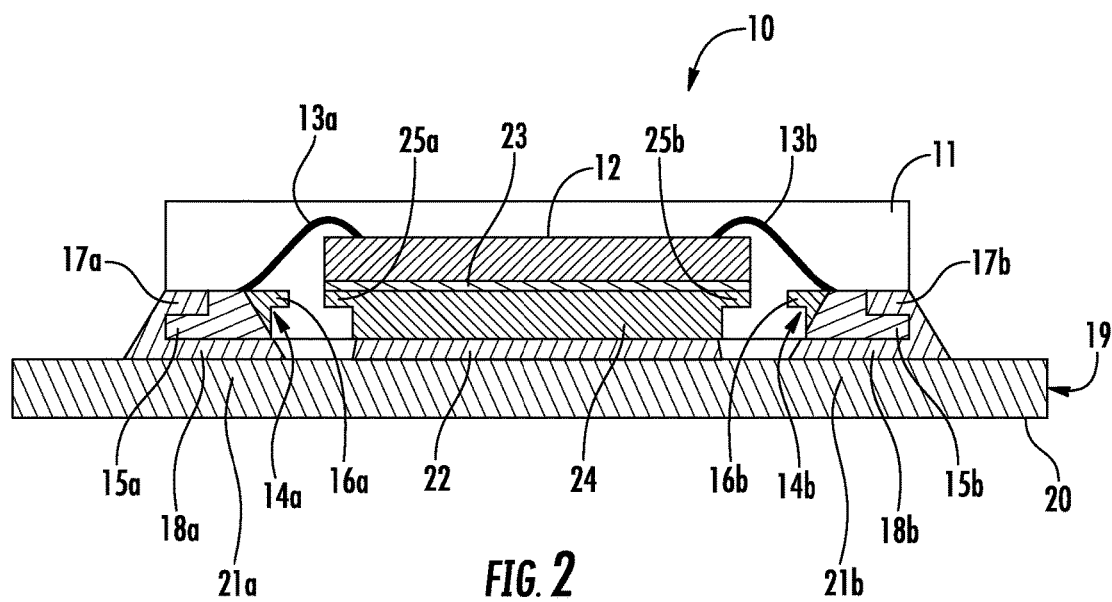
FIG. 2 is a schematic cross-section view of a semiconductor device, according to the present disclosure.
Figure 3A:
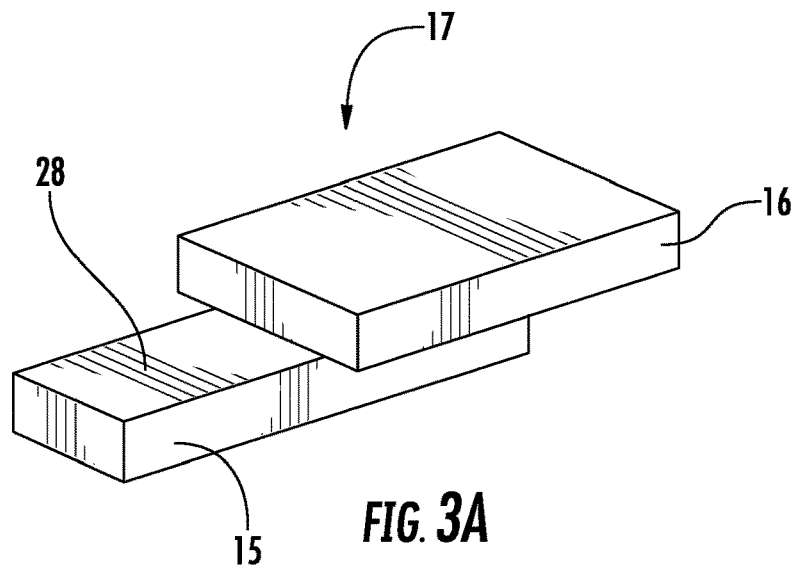
FIGS. 3A and 3B are schematic perspective views of the lead frame contact from the semiconductor device of FIG. 2 without and with encapsulation material being shown, respectively.
Figure 3B:
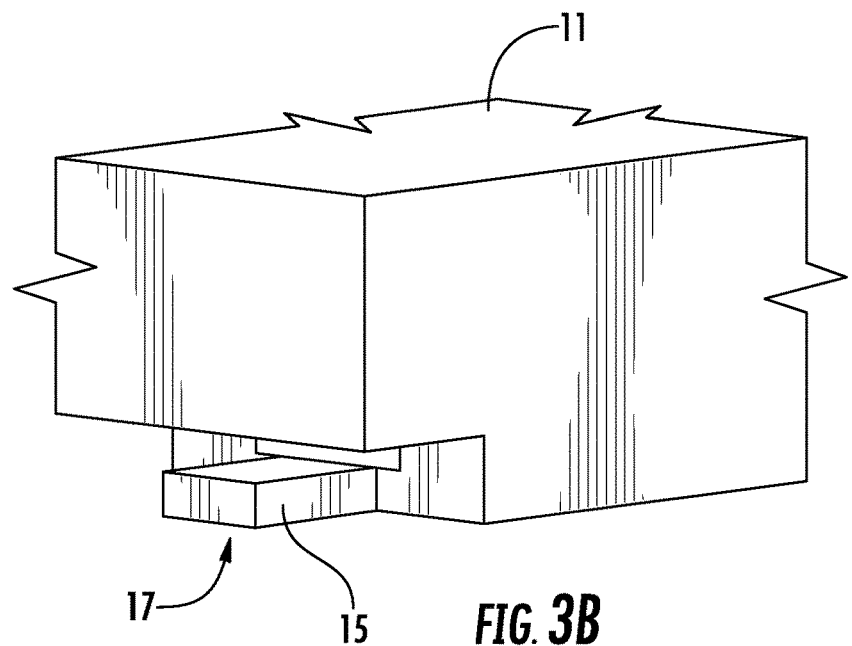
Figure 4:
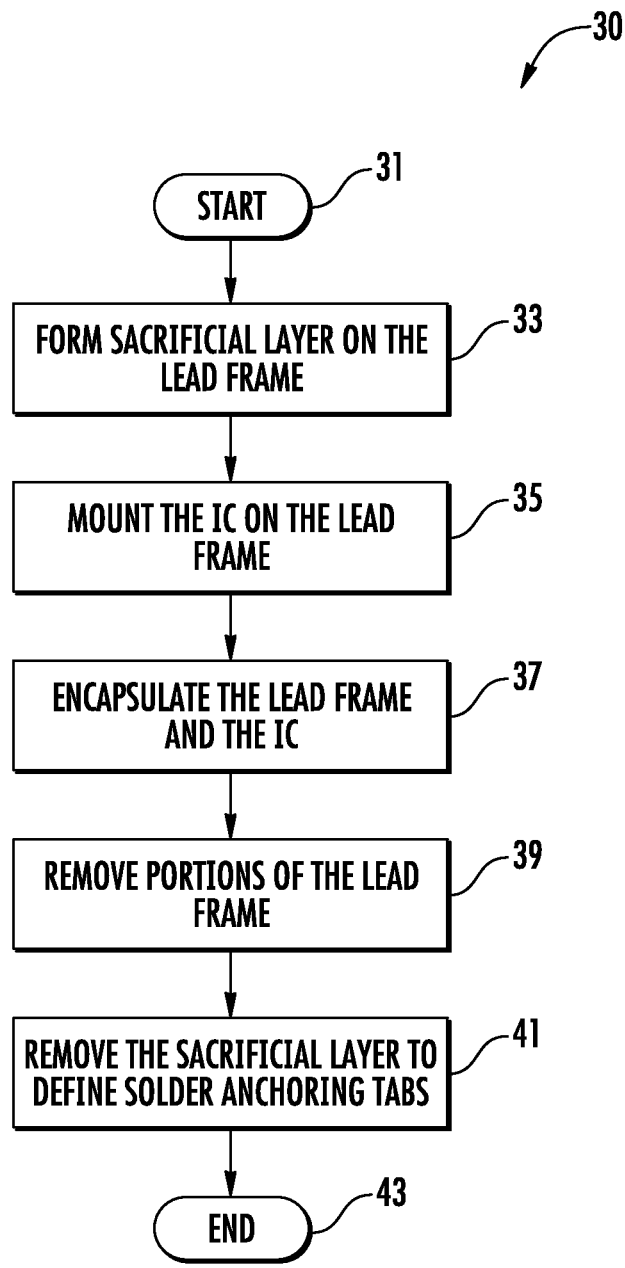
FIG. 4 is a flowchart illustrating a method for making the semiconductor device, according to the present disclosure.
Figure 5A:
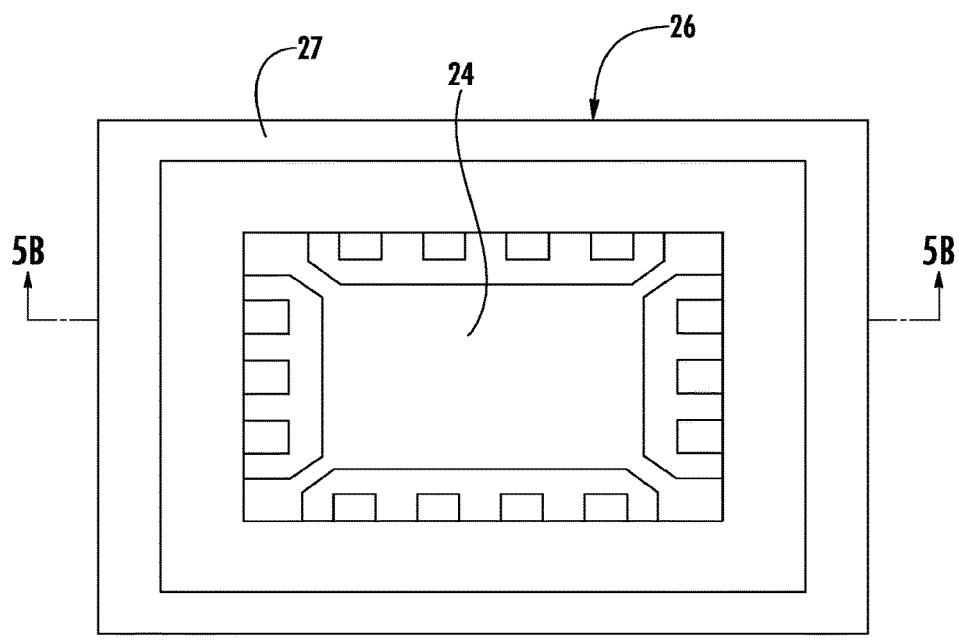
FIG. 5A is a schematic top plan view of a step in the method for making the semiconductor device, according to the present disclosure.
Figure 5B:
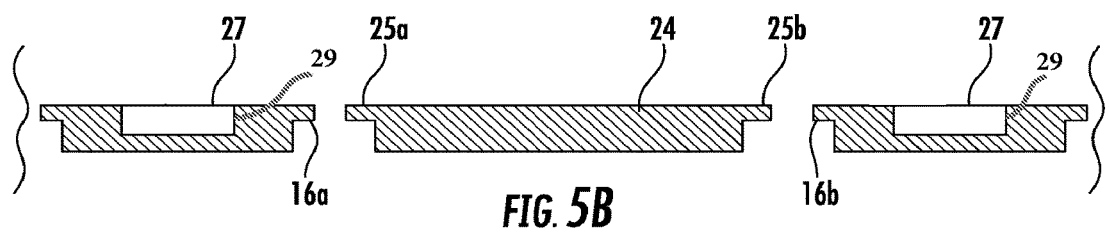
FIG. 5B is a schematic cross-section view of the step in the method for making the semiconductor device from FIG. 5A along line 5B-5B.
Figure 6:
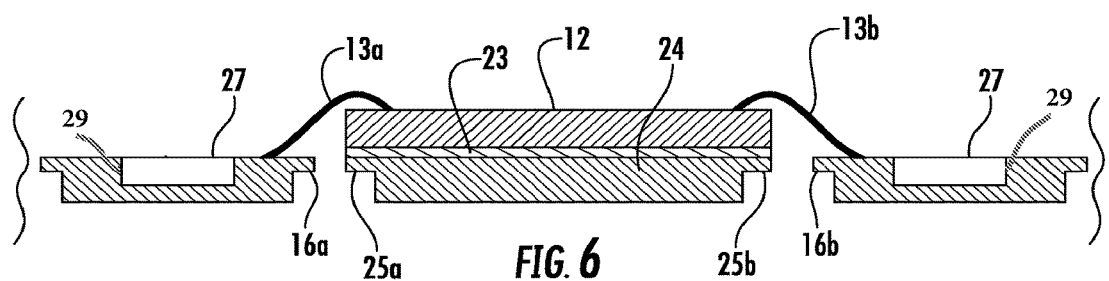
FIGS. 6-9 are schematic cross-section views of steps for making the semiconductor device along line 5B-5B, according to the present disclosure.

Referring now to FIGS. 2-3B, a semiconductor device 10 according to the present disclosure is now described. The semiconductor device 10 illustratively includes an IC 12, an IC die pad (e.g. copper, aluminum) 24 aligned with the IC, an adhesive layer 23 between the IC and the IC die pad, and a plurality of lead frame contacts (e.g. copper, aluminum) 14a-14b adjacent the IC die pad. The IC die pad 24 illustratively includes a plurality of mold anchoring tabs 25a-25b extending outwardly from an upper region of the IC die pad.

Each lead frame contact 14a-14b illustratively includes a solder anchoring tab 15a-15b extending outwardly at a lower region thereof. Also, each lead frame contact 14a-14b illustratively includes a mold anchoring tab 16a-16b extending inwardly from an upper region of the lead frame contact.

The semiconductor device 10 illustratively includes a plurality of bond wires (e.g. copper, aluminum, gold, silver) 13a-13b, each bond wire coupling a respective lead frame contact 14a-14b with the IC 12, and encapsulation material 11 surrounding the IC and the plurality of bond wires. Each lead frame contact 14a-14b defines a sidewall recess 17a-17b between the solder anchoring tab 15a-15b and the encapsulation material 11.

The semiconductor device 10 illustratively includes a circuit board layer 19, and an additional solder material layer 22 coupling the IC die pad 24 to the circuit board layer. The circuit board layer 19 illustratively includes a dielectric material substrate 20, and a plurality of contacts (e.g. copper, aluminum) 21a-21b carried by the dielectric material substrate. The semiconductor device 10 illustratively includes a plurality of solder bodies (e.g., tin, lead) 18a-18b surrounding the solder anchoring tabs 15a-15b and coupling the plurality of contacts 21a-21b and the plurality of lead frame contacts 14a-14b. In some embodiments, the solder anchoring tabs 15a-15b each includes a plating layer 28 (e.g. tin) on one or more surfaces. The plating layer 28 enhances physical attachment with the plurality of solder bodies 18a-18b.

In the illustrated embodiment, the plurality of solder bodies 18a-18b completely fills the sidewall recesses 17a-17b of the plurality of lead frame contacts 14a-14b. In other embodiments, this is not the case, and a portion of the sidewall recesses 17a-17b would remain, i.e. there is a gap between an upper surface of the plurality of solder bodies 18a-18b and the encapsulation material 11. Advantageously, in these other embodiments, the lead frame contacts 14a-14b have increased flexibility/pliability, which reduces stress on the semiconductor device 10 and improves board level reliability.

Referring now additionally to FIGS. 4-9, a method for making the semiconductor device 10 is now described with reference to flowchart 30 (Block 31). The method illustratively includes providing a lead frame 26 having a recess 29 therein, forming a sacrificial material 27 in the recess of the lead frame (Block 33), and mounting an IC 12 on the lead frame (Block 35). For example, the sacrificial material 27 may comprise a thermally decomposable material, a polymer, a water soluble material (water soluble synthetic polymer), or a photosensitive material. It should be appreciated that a carrier strip can provide a base for the method described herein.

The method illustratively includes encapsulating the IC 12 and the lead frame 26 (Block 37). Also, encapsulating includes forming the encapsulation material 11 to surround the mold anchoring tab 16a-16b of the lead frame 26.

The method illustratively includes forming a plurality of bond wires 13a-13b, each bond wire coupling a respective lead frame contact 14a-14b with the IC 12. The method illustratively includes removing portions of the lead frame 26 to define a plurality of lead frame contacts 14a-14b for the IC 12 (Block 39). More specifically, removing portions of the lead frame 26 illustratively includes singulating the IC 12 by dicing the lead frame at the recess 29 (e.g. using a dicing blade).

The method illustratively includes removing the sacrificial material 27 to define for each lead frame contact 14a-14b a solder anchoring tab 15a-15b extending outwardly at a lower region thereof and defining a sidewall recess 17a-17b between opposing portions of the solder anchoring tab and the encapsulation material 11 (Blocks 41, 43).

Since some surfaces of the lead frame contacts 14a-14b are not wettable after the singulation step, the side surface or the cut lead surface created during singulation can be made wettable with a post plating step. Accordingly, in some embodiments, the method further comprises forming a plating layer 28 (e.g. tin) on the solder anchoring tab 15a-15b.

Figure 1:
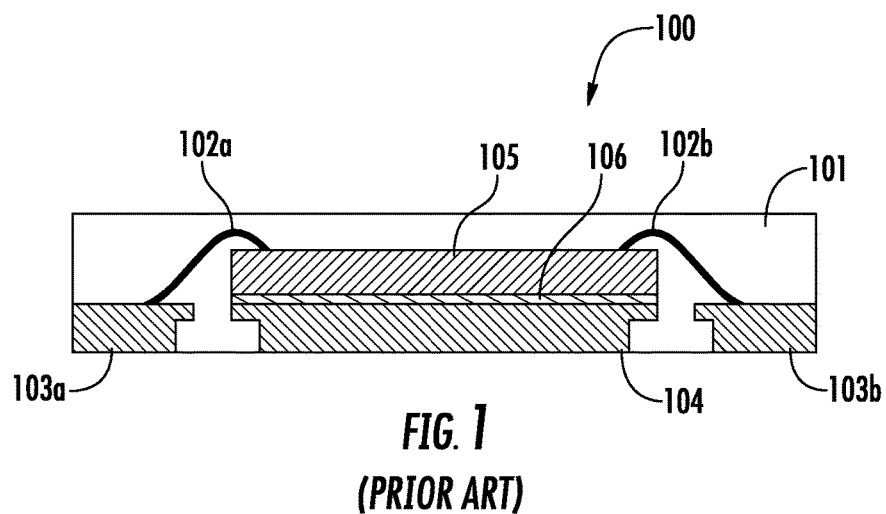
FIG. 1 is a schematic cross-section view of a semiconductor device, according to the prior art.

In typical electronic devices, such as the one depicted in FIG. 1, the QFN package may have some drawbacks. In particular, the problems during package assembly include strip handling damage when using thin lead frame strips, and lead frame instability (i.e. lead bouncing) during formation of the bond wires as lead dimensions get smaller. The problems may also include insufficient solder anchoring during package surface mounting to a circuit board.

Figure 7:
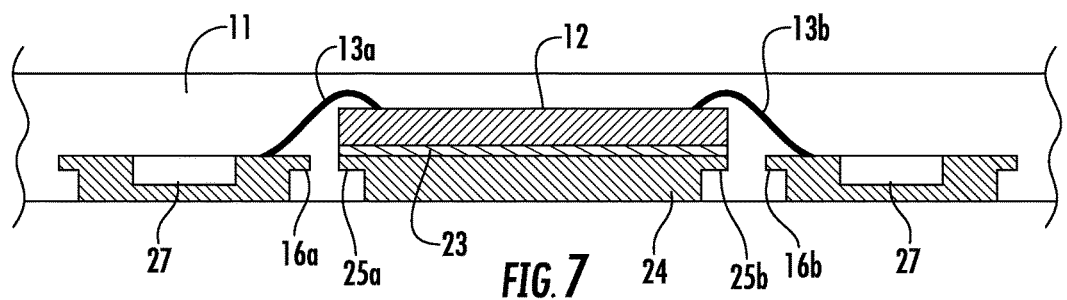
Figure 8:
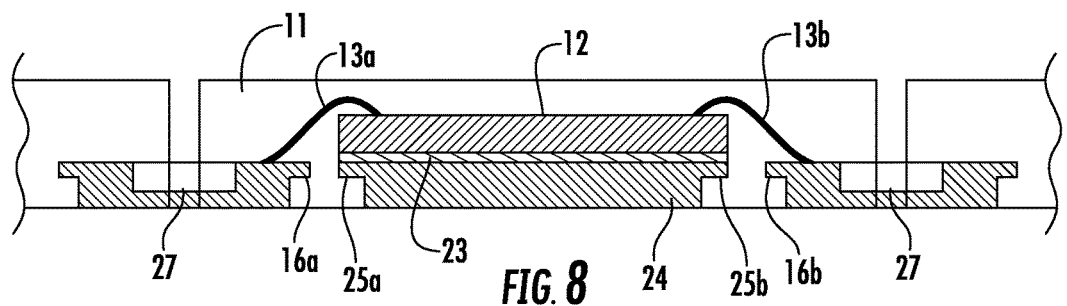
Figure 9:
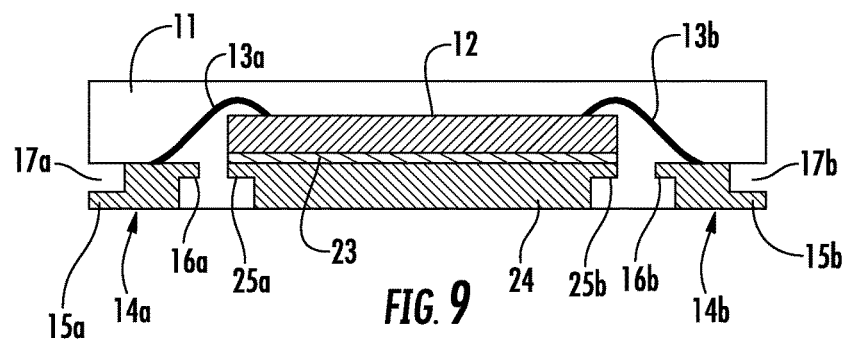

Advantageously, the above disclosed method for making the semiconductor device 10 uses a sacrificial material 27 comprising a thermally decomposable polymer that will increase the stiffness of the lead frame 26 during package assembly (i.e. the steps before encapsulation shown in FIG. 7). This may reduce strip handling damage and also increase stability during formation of the bond wires 13a-13b. Also, once the sidewall recesses 17a-17b are formed, the solder anchoring performance may be improved.

Also, the semiconductor device 10 may use existing saw-type QFN manufacturing process/equipment, and there is no need to procure punch-type equipment, thereby reducing costs and manufacturing complexity. Since more lead frame contact 14a-14b sidewalls are solder wettable, the mechanical attachment of to the circuit board layer 19 is stronger than in typical devices. As mentioned above, the semiconductor device 10 may provide improved board level reliability. In particular, simulations have shown a 41% increase in normalized solder life for the plurality of solder bodies 18a-18b in the worst case scenario (over and beyond the performance of the typical electronic device shown in FIG. 1).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A method for making a semiconductor device comprising:
   providing a lead frame having a recess therein;
   forming a sacrificial material in the recess of the lead frame, the sacrificial material having a top surface and an opposite bottom surface, after forming the sacrificial material, the top surface of the sacrificial material being coplanar with a top surface of the lead frame and the bottom surface of the sacrificial material contacting a bottom surface of the recess in the lead frame;
   mounting an integrated circuit (IC) on the lead frame;
   encapsulating the IC and the lead frame with an encapsulation material, the encapsulation material being different from the sacrificial material;
   removing portions of the lead frame to define a plurality of lead frame contacts for the IC; and
   removing the sacrificial material to define for each lead frame contact a solder anchoring tab extending outwardly at a lower region thereof and defining a sidewall recess between opposing portions of the solder anchoring tab and the encapsulation material.

2. The method of claim 1 wherein removing portions of the lead frame comprises singulating the IC by dicing the lead frame at the recess.

3. The method of claim 1 wherein the sacrificial material comprises at least one of a thermally decomposable material, a water soluble material, and a photosensitive material.

4. The method of claim 1 wherein the sacrificial material comprises a polymer.

5. The method of claim 1 further comprising forming a plurality of bond wires, each bond wire coupling a respective lead frame contact with the IC.

6. The method of claim 1 further comprising forming a plating layer on the solder anchoring tab.

7. The method of claim 1 wherein each lead frame contact comprises a mold anchoring tab extending inwardly from an upper region thereof.

8. The method of claim 7 wherein encapsulating comprises forming the encapsulation material to surround the mold anchoring tab.

9. The method of claim 1 wherein the lead frame defines an IC die pad having a plurality of mold anchoring tabs extending outwardly from an upper region thereof.

10. A method for making a semiconductor device comprising:
providing a lead frame having a recess therein;
forming a thermally decomposable sacrificial material in the recess of the lead frame, the thermally decomposable sacrificial material having a top surface and an opposite bottom surface, after forming the thermally decomposable sacrificial material, the top surface of the thermally decomposable sacrificial material being coplanar with a top surface of the lead frame and the bottom surface of the thermally decomposable sacrificial material contacting a bottom surface of the recess in the lead frame;
mounting an integrated circuit (IC) on the lead frame;
encapsulating the IC and the lead frame with an encapsulation material, the encapsulation material being different from the thermally decomposable sacrificial material;
removing portions of the lead frame to define a plurality of lead frame contacts for the IC, each lead frame contact comprising a mold anchoring tab extending inwardly from an upper region thereof; and
removing the thermally decomposable sacrificial material to define for each lead frame contact a solder anchoring tab extending outwardly at a lower region thereof and defining a sidewall recess between opposing portions of the solder anchoring tab and the encapsulation material.

11. The method of claim 10 wherein removing portions of the lead frame comprises singulating the IC by dicing the lead frame at the recess.

12. The method of claim 10 wherein the thermally decomposable sacrificial material comprises a polymer.

13. The method of claim 10 further comprising forming a plurality of bond wires, each bond wire coupling a respective lead frame contact with the IC.

14. The method of claim 10 further comprising forming a plating layer on the solder anchoring tab.

15. The method of claim 10 wherein encapsulating comprises forming the encapsulation material to surround the mold anchoring tab.

16. The method of claim 10 wherein the lead frame defines an IC die pad having a plurality of mold anchoring tabs extending outwardly from an upper region thereof.

17. A method for making a semiconductor device comprising:
providing a lead frame having a recess therein;
forming a water soluble sacrificial material in the recess of the lead frame, the water soluble sacrificial material having a top surface and an opposite bottom surface, after forming the water soluble sacrificial material, the top surface of the water soluble sacrificial material being coplanar with a top surface of the lead frame and the bottom surface of the water soluble sacrificial material contacting a bottom surface of the recess in the lead frame;
mounting an integrated circuit (IC) on the lead frame;
encapsulating the IC and the lead frame with an encapsulation material, the encapsulation material being different from the water soluble sacrificial material;
removing portions of the lead frame to define a plurality of lead frame contacts for the IC, each lead frame contact comprising a mold anchoring tab extending inwardly from an upper region thereof; and
removing the water soluble sacrificial material to define for each lead frame contact a solder anchoring tab extending outwardly at a lower region thereof and defining a sidewall recess between opposing portions of the solder anchoring tab and the encapsulation material.

18. The method of claim 17 wherein removing portions of the lead frame comprises singulating the IC by dicing the lead frame at the recess.

19. The method of claim 17 wherein the water soluble sacrificial material comprises a polymer.

20. The method of claim 17 further comprising forming a plurality of bond wires, each bond wire coupling a respective lead frame contact with the IC.

21. The method of claim 17 further comprising forming a plating layer on the solder anchoring tab.

22. The method of claim 17 wherein encapsulating comprises forming the encapsulation material to surround the mold anchoring tab.

23. The method of claim 17 wherein the lead frame defines an IC die pad having a plurality of mold anchoring tabs extending outwardly from an upper region thereof.

* * * * *